(12) United States Patent
Leong et al.

(10) Patent No.: US 8,505,248 B1
(45) Date of Patent: Aug. 13, 2013

(54) MINIMAL BALLASTED SURFACE MOUNTING SYSTEM AND METHOD

(75) Inventors: Wilson Leong, San Carlos, CA (US); Alex Au, Campbell, CA (US)

(73) Assignee: Andalay Solar, Inc., Los Gatos, CA (US)

(*) Notice: Subject to any disclaimer, the term of this patent is extended or adjusted under 35 U.S.C. 154(b) by 1264 days.

(21) Appl. No.: 12/049,232

(22) Filed: Mar. 14, 2008

Related U.S. Application Data

(63) Continuation-in-part of application No. 11/859,724, filed on Sep. 21, 2007.

(51) Int. Cl.
*H01L 31/042* (2006.01)

(52) U.S. Cl.
USPC ........................................ 52/173.3

(58) Field of Classification Search
USPC ............ 52/586.1, 562, 582.1, 200, 22, 173.3, 52/251, 586.2, 656.1, 665; 403/292; 136/244, 136/251; 126/704, 623
See application file for complete search history.

(56) References Cited

U.S. PATENT DOCUMENTS

| | | | |
|---|---|---|---|
| 559,924 A | 5/1896 | Arnold |
| 2,554,915 A | 5/1951 | Metts |
| 3,630,253 A | 12/1971 | Sherman |
| 3,658,596 A | 4/1972 | Osborne |
| 4,012,155 A | 3/1977 | Morris |
| 4,047,516 A | 9/1977 | Bruel et al. |
| 4,109,564 A | 8/1978 | Widerby |
| 4,112,922 A | 9/1978 | Skinner et al. |
| 4,146,785 A | 3/1979 | Neale |
| 4,154,223 A | 5/1979 | Lof |
| 4,155,346 A | 5/1979 | Aresty |
| 4,215,677 A | 8/1980 | Erickson |
| 4,217,825 A | 8/1980 | Bruckner |
| 4,219,011 A | 8/1980 | Knoos |
| 4,271,825 A | 6/1981 | Schwob et al. |
| 4,308,858 A | 1/1982 | Skillman |
| 4,310,182 A | 1/1982 | Vandenbossche |
| 4,312,325 A | 1/1982 | Voges et al. |
| 4,353,356 A | 10/1982 | Vandenbossche |
| 4,371,139 A | 2/1983 | Clark |
| 4,429,872 A | 2/1984 | Capachi |
| 4,505,261 A | 3/1985 | Hunter |
| 4,570,408 A | 2/1986 | Frascaroli et al. |
| 4,691,818 A | 9/1987 | Weber |
| 4,718,185 A | 1/1988 | Conlin et al. |

(Continued)

FOREIGN PATENT DOCUMENTS

| | | |
|---|---|---|
| DE | 3111969 | 10/1982 |
| DE | 44 44 439 A1 | 4/1995 |

(Continued)

OTHER PUBLICATIONS

PCT/US2009/037021 International Preliminary Report on Patentability dated Sep. 14, 2010.

(Continued)

*Primary Examiner* — Mark Wendell
(74) *Attorney, Agent, or Firm* — DLA Piper LLP (US)

(57) ABSTRACT

A minimal, ballasted roof mounting system and method are provided. The mounting system has a staggered interlocking mounting structure, movable anchors, aerodynamic deflectors that also act as thermal chimneys and grounding of the solar panels without external wiring.

20 Claims, 17 Drawing Sheets

(56) References Cited

U.S. PATENT DOCUMENTS

| | | |
|---|---|---|
| 4,766,712 A | 8/1988 | Hale |
| 4,966,631 A | 10/1990 | Matlin |
| 5,046,791 A | 9/1991 | Kooiman |
| 5,127,762 A | 7/1992 | Havlovitz |
| 5,134,827 A | 8/1992 | Hartman |
| 5,143,556 A | 9/1992 | Matlin |
| 5,144,780 A | 9/1992 | Gieling et al. |
| 5,164,019 A | 11/1992 | Sinton |
| 5,164,020 A | 11/1992 | Wagner et al. |
| 5,203,135 A | 4/1993 | Bastian |
| 5,205,694 A | 4/1993 | Nagoshi et al. |
| 5,232,518 A | 8/1993 | Nath |
| 5,316,592 A | 5/1994 | Dinwoodie |
| 5,333,602 A | 8/1994 | Huang |
| 5,338,369 A | 8/1994 | Rawlings |
| 5,497,587 A | 3/1996 | Hirai et al. |
| 5,505,788 A | 4/1996 | Dinwoodie |
| D374,169 S | 10/1996 | Kopish |
| 5,571,338 A | 11/1996 | Kadonome et al. |
| 5,596,981 A | 1/1997 | Soucy |
| 5,628,580 A | 5/1997 | Rinderer |
| D387,655 S | 12/1997 | Kopish |
| 5,706,617 A | 1/1998 | Hirai |
| 5,746,029 A | 5/1998 | Ullman |
| 5,746,839 A | 5/1998 | Dinwoodie |
| 5,787,653 A | 8/1998 | Sakai |
| 5,960,790 A | 10/1999 | Rich |
| 6,061,978 A | 5/2000 | Dinwoodie |
| 6,093,884 A | 7/2000 | Toyomura et al. |
| 6,105,317 A | 8/2000 | Tomiuchi et al. |
| 6,111,189 A | 8/2000 | Garvison et al. |
| 6,148,570 A | 11/2000 | Dinwoodie et al. |
| 6,201,180 B1 | 3/2001 | Meyer et al. |
| 6,207,889 B1 | 3/2001 | Toyomura et al. |
| 6,269,596 B1 | 8/2001 | Ohtsuka et al. |
| 6,274,402 B1 | 8/2001 | Verlindon et al. |
| 6,295,818 B1 | 10/2001 | Ansley et al. |
| 6,313,395 B1 | 11/2001 | Crane et al. |
| 6,337,283 B1 | 1/2002 | Verlindon et al. |
| 6,360,491 B1 | 3/2002 | Ullman |
| 6,370,828 B1 | 4/2002 | Genschorek |
| 6,387,726 B1 | 5/2002 | Verlindon et al. |
| 6,423,568 B1 | 7/2002 | Verlindon et al. |
| 6,465,724 B1 | 10/2002 | Garvison et al. |
| 6,495,750 B1 * | 12/2002 | Dinwoodie ............... 136/251 |
| 6,501,013 B1 | 12/2002 | Dinwoodie |
| 6,523,320 B2 | 2/2003 | Stoof |
| 6,534,702 B1 | 3/2003 | Makita et al. |
| 6,534,703 B2 | 3/2003 | Dinwoodie |
| 6,568,873 B1 | 5/2003 | Peterson |
| 6,570,084 B2 | 5/2003 | Dinwoodie |
| 6,586,668 B2 | 7/2003 | Shugar et al. |
| 6,634,077 B2 | 10/2003 | Layfield |
| 6,670,541 B2 | 12/2003 | Nagao et al. |
| 6,672,018 B2 | 1/2004 | Shingleton |
| 6,675,545 B2 | 1/2004 | Chen et al. |
| 6,675,580 B2 | 1/2004 | Ansley et al. |
| 6,676,326 B2 | 1/2004 | Wu |
| 6,722,357 B2 | 4/2004 | Shingleton |
| 6,761,008 B2 | 7/2004 | Chen et al. |
| 6,784,360 B2 | 8/2004 | Nakajima et al. |
| 6,809,251 B2 | 10/2004 | Dinwoodie |
| 6,809,253 B2 | 10/2004 | Dinwoodie |
| 6,935,623 B2 | 8/2005 | Cook |
| D510,315 S | 10/2005 | Shugar et al. |
| D511,576 S | 11/2005 | Shingleton et al. |
| 6,959,517 B2 | 11/2005 | Poddany et al. |
| D516,017 S | 2/2006 | Mascolo |
| 6,993,917 B2 | 2/2006 | Unger et al. |
| D519,444 S | 4/2006 | Mascolo |
| 7,043,884 B2 | 5/2006 | Moreno |
| 7,172,184 B2 | 2/2007 | Pavani et al. |
| 7,297,867 B2 | 11/2007 | Nomura |
| D562,225 S | 2/2008 | Almy et al. |
| 7,328,534 B2 | 2/2008 | Dinwoodie |
| D564,958 S | 3/2008 | Almy et al. |
| 7,339,110 B1 | 3/2008 | Mulligan et al. |
| D565,505 S | 4/2008 | Shugar et al. |
| 7,406,800 B2 | 8/2008 | Cinnamon et al. |
| 7,435,897 B2 | 10/2008 | Russell |
| 7,554,041 B2 | 6/2009 | Ducret |
| 7,592,537 B1 | 9/2009 | West |
| 7,634,875 B2 | 12/2009 | Genschorek |
| 7,740,497 B2 | 6/2010 | Nightingale |
| 7,774,998 B2 | 8/2010 | Aschenbrenner |
| 7,866,098 B2 | 1/2011 | Cinnamon |
| 7,987,641 B2 | 8/2011 | Cinnamon |
| 8,234,824 B2 * | 8/2012 | Botkin et al. .............. 52/173.3 |
| 2002/0046506 A1 | 4/2002 | Ullman |
| 2002/0112435 A1 | 8/2002 | Hartman |
| 2002/0193001 A1 | 12/2002 | Yoshikawa |
| 2003/0010372 A1 | 1/2003 | Dinwoodie |
| 2003/0015637 A1 | 1/2003 | Liebendorfer |
| 2003/0070368 A1 | 4/2003 | Shingleton |
| 2003/0175071 A1 | 9/2003 | Layfield |
| 2003/0201009 A1 | 10/2003 | Nakajima |
| 2004/0007260 A1 * | 1/2004 | Dinwoodie ............... 136/251 |
| 2004/0063265 A1 | 4/2004 | Noble |
| 2004/0140002 A1 | 7/2004 | Brown et al. |
| 2004/0163338 A1 | 8/2004 | Liebendorfer |
| 2004/0179892 A1 | 9/2004 | Du Preez |
| 2005/0115176 A1 | 6/2005 | Russell |
| 2005/0123373 A1 | 6/2005 | Hufnagl et al. |
| 2005/0257453 A1 | 11/2005 | Cinnamon et al. |
| 2006/0005875 A1 | 1/2006 | Haberlein |
| 2006/0118163 A1 | 6/2006 | Plaisted et al. |
| 2007/0074755 A1 | 4/2007 | Eberspacher et al. |
| 2007/0079865 A1 | 4/2007 | Warfield et al. |
| 2007/0102036 A1 | 5/2007 | Cinnamon |
| 2007/0144575 A1 * | 6/2007 | Mascolo et al. .............. 136/246 |
| 2007/0151594 A1 * | 7/2007 | Mascolo et al. .............. 136/245 |
| 2007/0157963 A1 | 7/2007 | Metten et al. |
| 2008/0029144 A1 | 2/2008 | Brazier et al. |
| 2008/0160819 A1 | 7/2008 | Daily et al. |
| 2009/0025314 A1 | 1/2009 | Komamine |
| 2009/0078299 A1 | 3/2009 | Cinnamon |
| 2009/0242014 A1 * | 10/2009 | Leary ............................ 136/251 |
| 2010/0018571 A1 | 1/2010 | Placer |
| 2010/0065108 A1 | 3/2010 | West et al. |
| 2011/0099929 A1 | 5/2011 | Liegeois et al. |

FOREIGN PATENT DOCUMENTS

| | | |
|---|---|---|
| DE | 2970348 U | 11/1997 |
| DE | 29703481 | 11/1997 |
| DE | 19906464 | 8/2000 |
| DE | 102005002828 | 8/2006 |
| EP | 1 783 440 | 5/2007 |
| JP | 47-023570 | 7/1971 |
| JP | 47-057885 | 5/1972 |
| JP | 57-087561 | 1/1982 |
| JP | 57-077856 | 5/1982 |
| JP | 58-133945 | 9/1983 |
| JP | 59-191748 | 12/1984 |
| JP | 02-42449 | 3/1990 |
| JP | 04-052367 | 2/1992 |
| JP | 04-194485 | 4/1992 |
| JP | 06-069527 | 3/1994 |
| JP | 06-41156 | 5/1994 |
| JP | 08-296311 | 11/1996 |
| JP | 10-019175 | 1/1998 |
| JP | 10-176403 | 6/1998 |
| JP | 10-266499 | 10/1998 |
| JP | 10-317619 | 12/1998 |
| JP | 10-317621 | 12/1998 |
| JP | 10-317622 | 12/1998 |
| JP | 11-002004 | 1/1999 |
| JP | 11-002011 | 1/1999 |
| JP | 11-006262 | 1/1999 |
| JP | 11-040835 | 2/1999 |
| JP | 11-222991 | 8/1999 |
| JP | 2000-150947 | 5/2000 |
| JP | 2000-345664 | 12/2000 |
| JP | 2001-148493 | 5/2001 |
| JP | 2001-210853 | 8/2001 |

| | | |
|---|---|---|
| JP | 2002-294957 | 10/2002 |
| JP | 2003-227207 | 8/2003 |
| JP | 2005-268529 | 9/2005 |
| JP | 10-159284 | 6/2008 |
| WO | WO 2005116359 | 12/2005 |
| WO | WO 2007103882 | 9/2007 |

OTHER PUBLICATIONS

PCT/US2009/037021 International Search Report dated May 12, 2009.
PCT/US2009/037021 Written Opinion dated May 12, 2009.
JP Pub. 2002-141541 Patent Abstracts of Japan, dated May 17, 2002.
JP Pub. 61-040963 Japanese Examined Utility Model.
JP Pub. 07-202242 Patent Abstracts of Japan, dated Aug. 4, 1995.
"Notification of Reasons for Rejection", mailing date Jun. 9, 2009; Japanese Application No. JP2007-527321; 9321 2E00; Patent Attorney : Hironori Onda; Mamoru.
PCT/US05/16849 International Search Report dated Jun. 18, 2008.
PCT/US05/16849 Written Opinion dated Jun. 18, 2008.
PCT/US08/10992 International Search Report dated Nov. 25, 2008.
PCT/US08/10992 Written Opinion dated Nov. 25, 2008.
US 5,819,447, 10/13/1998, Yamawaki (withdrawn).
PCT International Search Report and Written Opinion of PCT/US11/039519; dated Dec. 2, 2011 (13 pages).

* cited by examiner

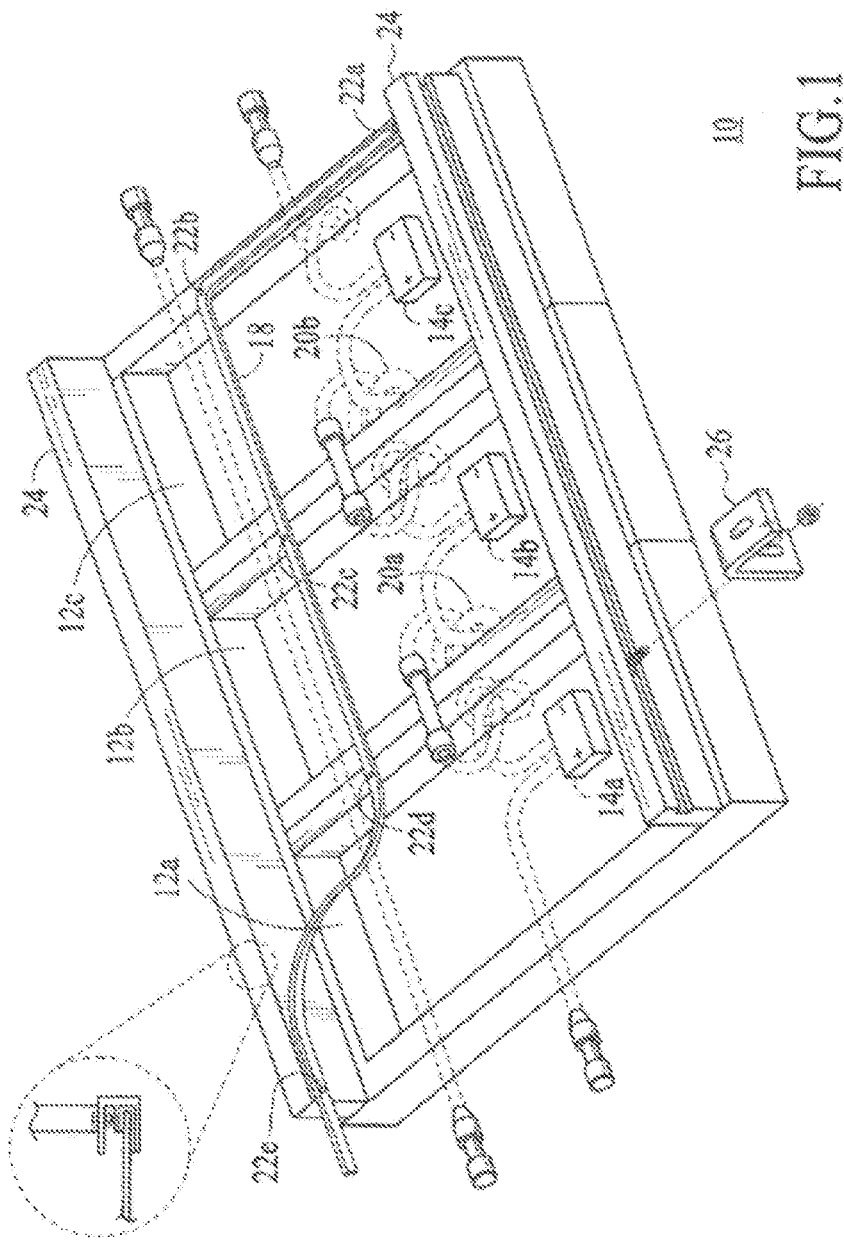

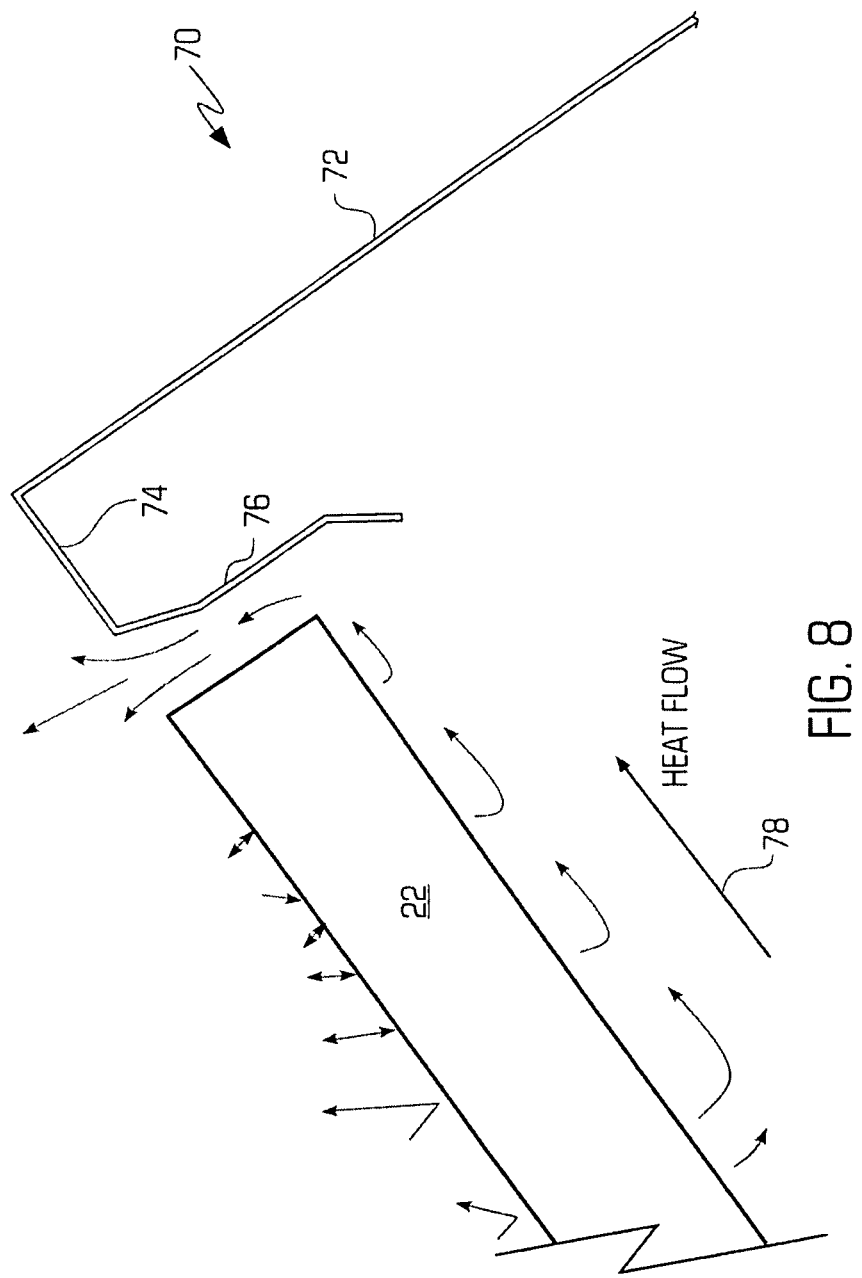

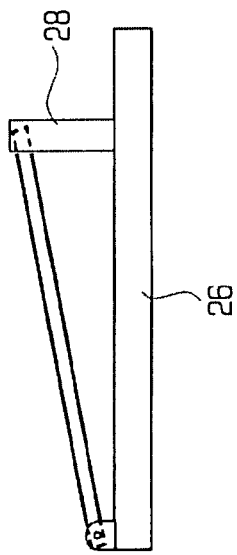
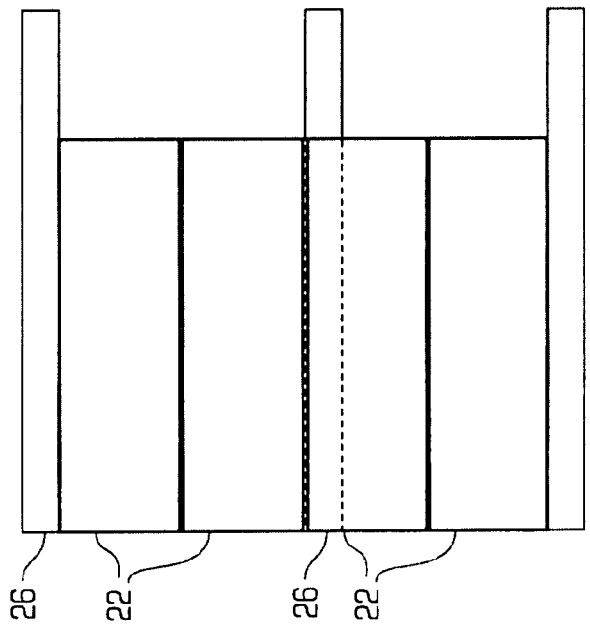
INSTALLATION SEQUENCE
5. PLACE PAN INTO POSITION
6. INSTALL UPRIGHTS ONTO PAN
7. INSTALL SOLAR PANELS ONTO PAN
8. TILT UP PANEL AND FASTEN TO TOP OF UPRIGHT
FIG. 15A
FIG. 15B

INSTALLATION SEQUENCE

9. PLACE PANS INTO POSITION
10. INSTALL UPRIGHTS ONTO PAN
11. INSTALL SOLAR PANELS ONTO PAN (SEE FIG. 13)
12. TILT UP PANEL AND FASTEN TO TOP OF UPRIGHT
13. REPEAT PROCESS

MINIMAL BALLASTED SURFACE MOUNTING SYSTEM AND METHOD

PRIORITY CLAIMS

This application claims priority under 35 USC 120 and is a continuation in part of U.S. patent application Ser. No. 11/859,724 (filed on Sep. 21, 2007 and entitled "Mounting System for Solar Panels") which is incorporated herein by reference.

FIELD

The system and method relate to the mounting of a photovoltaic solar panel system on a surface, such as a substrate or flat roof membrane.

BACKGROUND OF PRIOR TECHNOLOGY

Photovoltaic solar electric systems, the most environmentally friendly way of generating electricity, are typically comprised of a plurality of solar modules, which are coupled together and then mounted on a roof of a building or a dedicated ground or pole mounted frame. FIG. 1 illustrates a conventional solar panel assembly 10 with underlying rails for attachment. The solar panel in this embodiment comprises three solar modules, 12A-12C. One of ordinary skill in the art recognizes there could be any number of modules and they could be in various configurations to form a solar panel that when turned over attaches directly to a roof or a mounting system through multiple penetrations via the rails 24.

Each of the solar panel modules 12A-12C includes a junction box 14A-14C which receives cables 16, which are applied in serial fashion from one module to the next. Also included within each of these modules 12A-12C is an electrical ground wire assembly 18, which is used to ground the modules and the underlying frame at the appropriate points. In addition, each of the modules includes extra wiring from nearby modules that must be wrapped and tied down in between, as shown at 20A and 20B to ensure that the wires do not get damaged. FIG. 1A is a view of the grounding screw for the solar panel. The screw or bolt assembly 22, which must be provided in several places, attaches the ground wire assembly 18 to each piece of equipment in the assembly at least once, in this case five (5) places, on each of the solar modules 12A-12C and underlying frame, thereby creating a grounded assembly.

Referring back in FIG. 1, the two metal rails 24 that extend in parallel with and along the length of the solar modules 12A-12C form the underlying support structure for the solar modules. The rails are attached to the roof so that the entire solar panel can be mounted in a single rigid geometric plane on the roof, thereby improving the durability and aesthetics of the installation. In some cases the rails are mounted to the roof first (attached to the roof with L shaped brackets and lag bolts to the underlying rafters), and then the modules are attached to the rails with bolt-fastened clips, In other cases, as shown in FIG. 1B, the rails are attached to the modules first (in this case with hex nuts and bolts or in other cases clips), and then the entire module-rail assembly (or panel) is attached to the roof with L shaped brackets 26 (FIG. 1) and lag bolts to the underlying rafters. These rails 24 are also electrically grounded as indicated above.

For ventilation and drainage purposes it is beneficial to mount the panel above the roof with a small air gap between the roof surface and underside of the modules and rails. For wiring and grounding purposes for roof assembled panels it is beneficial to have access below the modules so that wires can be connected and tied. For single geometric plan purposes it is beneficial to provide some vertical adjustability of the mounting point to account for variability (waviness) in roof surfaces. For these reasons the roof mounting bracket (whether it is an L shaped bracket or different design) generally provides some vertical adjustability (typically 1-3 inches). Moreover, roof attachments must be made to a secure underlying surface, generally a rafter. These rafters may not be consistently spaced. Therefore, the mounting rails typically include some kind of adjustable groove so that the mounting point from the rail to the roof attachment (L bracket) can be directly over a secure mounting point—wherever this point may be.

The conventional solar panel 10 requires many individual operations to construct and mount in order to provide a reliable and high performance photovoltaic solar electric systems. Mounting on uneven roof surfaces requires many small parts and adjustments.

Making sure there is airflow and drainage requires the panel to be raised off the roof slightly, but aesthetic considerations require the panel to be close to the roof. Each module in the panel must be wired together, extra wiring must be tucked away securely, and every conductive component must be electrically grounded. All the required parts and steps increase the cost of the system, which ultimately negatively affects the payback of the system. In addition, conventional solar modules are shipped in cardboard boxes on palettes, requiring additional shipping costs and substantial unpacking and cardboard disposal costs.

There are two primary types of conventional flat roof mounting systems. One conventional type is a rail type system. Some rail systems have good mechanical strength with a plurality of rails that are bolted into a roof membrane. However, the rails add weight to the roof and require using a multitude of associated mounting parts that add to the complexity of the planning, logistics, and installation process. In addition, the plurality of rails mean many roof penetrations, each penetration is a potential source of roof leaks and the securing the rails to the roof requires additional materials and labor. The rail systems are often custom built during the installation, utilizing even more labor and time. In addition, the grounding and electrical wiring required by the rail system is complex and labor intensive.

The other conventional type is a flat roof mounting system which creates a modular system via pods of panels that either attach or sit on the roof membrane or mounting system and depend on geometric design or penetrations to resist wind uplift. This type of mounting system, like the conventional rail system mount, utilizes many different parts which create planning, logistic and labor challenges. Further, as with the rail systems, the grounding and electrical wiring required by the conventional roof mounting system is complex and labor intensive. Additionally, the conventional roof mounting system is scalable, but looses structural strength as it grows in size and does not provide for versatility in configuration.

Thus, it is desirable to provide a minimal ballasted surface mounting system and method that overcomes these limitations of conventional mounting systems.

SUMMARY OF INVENTION

A minimal ballasted surface mounting system and method are provided. The minimal ballasted surface mounting system provides a roofing assembly with interlocking features that causes the photovoltaic solar system to become stronger, as additional solar panels are added to the array. The minimal ballasted surface mounting system also provides for adjustability in its components so that the solar panels can be tilted at different angles to accommodate for different environmental and roof conditions. Unlike other mounting systems that depend on wind resistance to remain in place, the minimal ballasted surface mounting system is a heavyweight mounting system that relies on structural integrity of components for durability and longer lifetime functionality. The minimal ballasted surface mounting system also has fewer parts than conventional roof mounting systems providing a reduction in parts and labor costs. Additional cohesiveness and strength is also gained from the system's ability to work in combination with the unique overlying solar array, unlike conventional mounting systems which function independent of the panel array. The minimal ballasted surface mounting system also reduces the components necessary to ground the photovoltaic solar panel system because an external grounding wire is not required due to the grounding path formed by the solar panels and splices that attach the solar panels to the mounting frame.

BRIEF DESCRIPTION OF THE DRAWINGS

FIG. 8 illustrates an aerodynamic deflector of the minimal ballasted roof mounting system that also acts as a thermal chimney;

FIGS. 15A-15B illustrate a second process for assembling a photovoltaic solar panel system using the minimal, ballasted roof mounting system;

DETAILED DESCRIPTION OF ONE OR MORE EMBODIMENTS

The system and method are particularly applicable to the mounting of an Andalay solar panel made by Akeena Solar, Inc. and it is in this context that the system and method will be described. It will be appreciated, however, that the mounting system and method has greater utility since it can be used with any type of solar panel or other device that may be mounted on the flat roof of a building.

Figure 1A:
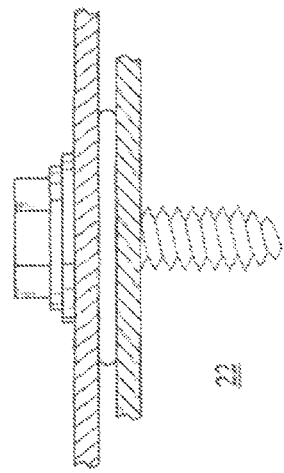
FIGS. 1-1B illustrate a conventional solar panel assembly.
Figure 1B:
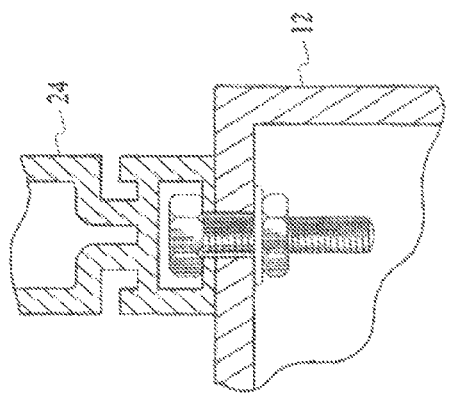
Figure 2:
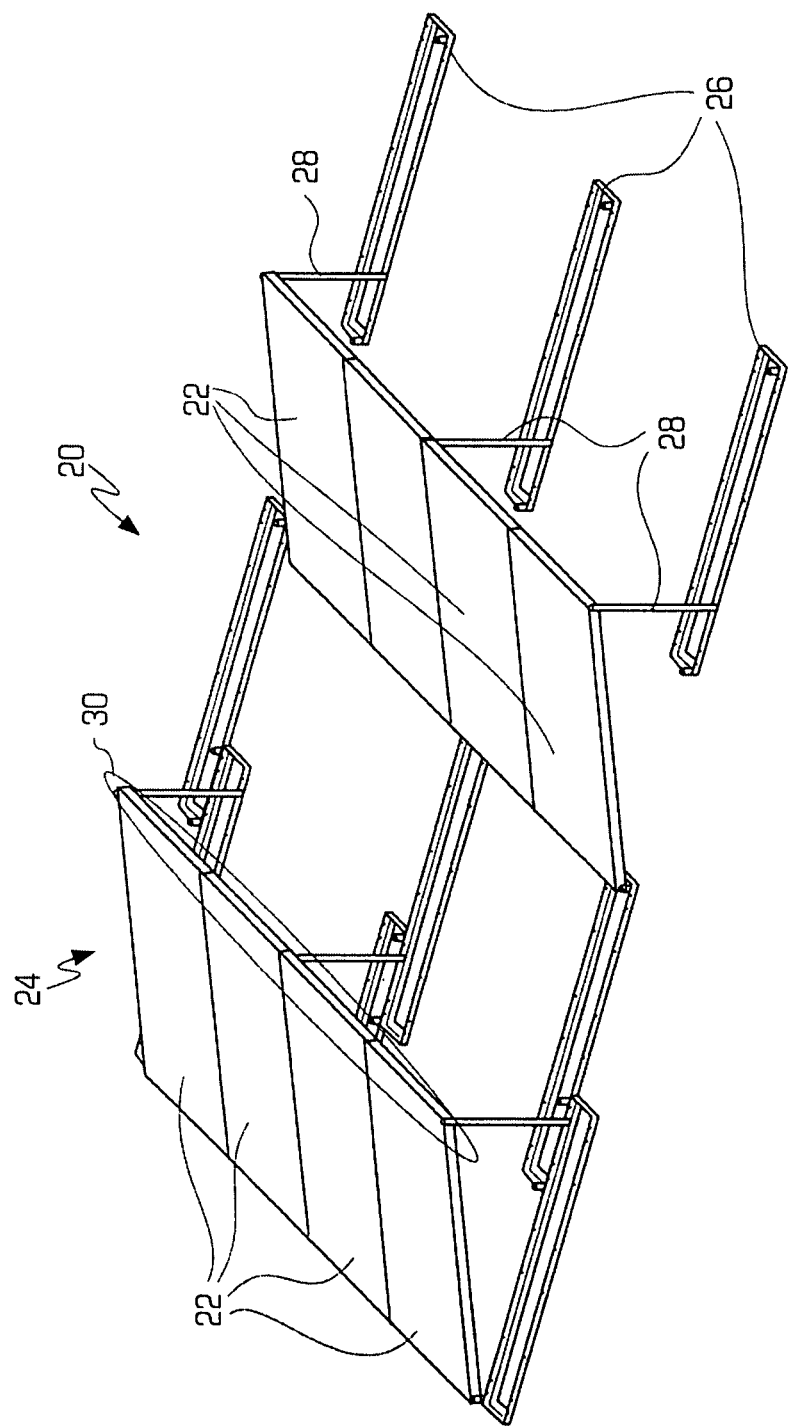
FIG. 2 is an isometric view of a photovoltaic solar panel system that uses a minimal, ballasted roof mounting system.

FIG. 2 is an isometric view of a photovoltaic solar panel system 20 that uses the minimal, ballasted roof mounting system. The photovoltaic solar panel system 20 has one or more solar panels 22 wherein the solar panels may be connected together to form a solar module 24 (with four solar panels in the example shown in FIG. 1 although the photovoltaic solar panel system may have one or more solar panels in each solar module.) Further details of the solar panels, the solar module and how the solar panels are coupled to each other using splices is described in more detail in U.S. patent application Ser. No. 11/859,724, filed on Sep. 21, 2007 and entitled "Mounting System for Solar Panels which is incorporated herein by reference. In the example shown in FIG. 2, the photovoltaic solar panel system rests on top of the surface, such as a flat roof. However, the photovoltaic solar panel system may also be attached to the roof in certain installations.

The solar panels in the solar module are coupled together as described below and the solar panels/solar modules are mounted onto a flat surface, such as a flat roof, by a minimal, ballasted roof mounting system. The minimal, ballasted roof mounting system may include one or more base pans 26 that interlock with each other wherein the base pans may rest on the flat surface such as a flat roof so that it is not necessary to secure the base pans or the photovoltaic solar panel system to the flat surface. Each base pan 26 may be of various shapes but has a length that is sufficient to secure each end of the solar panel 22 to the base pan. In one embodiment, the base pan 26 may have a rectangular shape as shown in FIG. 2. The minimal, ballasted roof mounting system may further include one or more upright portions 28 (with different lengths as described in more detail below with reference to FIG. 6) that connect to the base pans 26 and attach to an upper portion 30 of the one or more solar panels that are part of the solar module. The upright portions 28 position the solar panels and solar module at a predetermined tilt angle relative to the flat surface wherein the tilt angle can be adjusted by using different length upright portions. The one or more base pans and the one or more upright portions are a mounting frame for the photovoltaic solar panel system.

Figure 3:
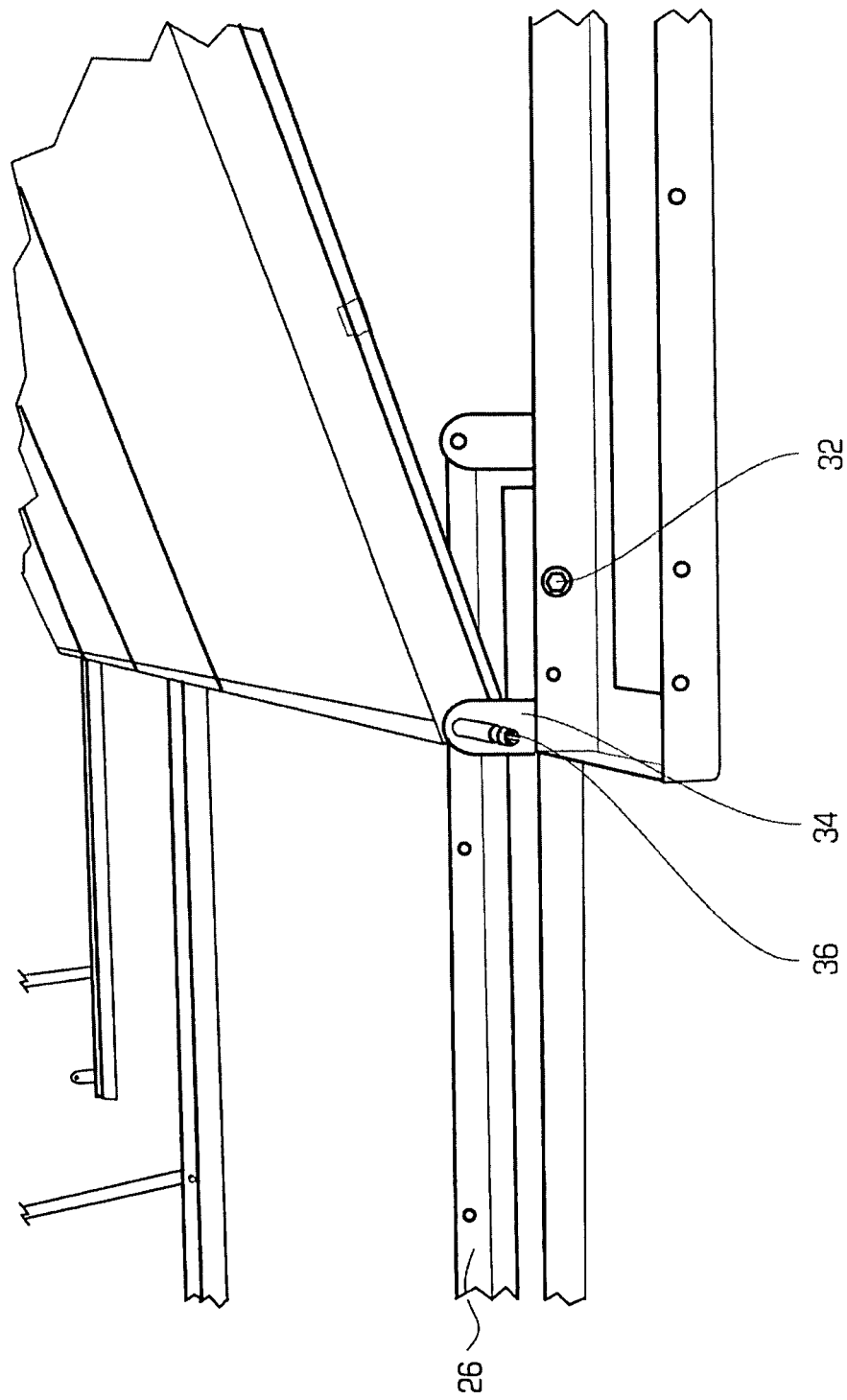
FIG. 3 illustrates more details of the minimal, ballasted roof mounting system.

As shown in FIG. 3, the base pans 26 of the minimal, ballasted roof mounting system are connected to each other by an attachment mechanism 32, such as a bolt and nut or any other attachment mechanism, that secures the two base pans 26 to each other to form the interlocking structure of the minimal, ballasted roof mounting system. Thus, the interlocking base pans in combination with the different tilt angles of the solar panels using the upright portion 28 allow the minimal, ballasted roof mounting system to have numerous configurations wherein the particular configuration can be customized for a particular roof or other flat surface.

Thus, the thickness of the base pans and upright portions provides stability for the photovoltaic solar panel system assembled with the solar panels described in the co-pending application Ser. No. 11/859,724. In addition, when the base pans are connected to each other with the attachment mechanism, the connected base pans provide lateral rigidity of rows of solar panels while the splices in between the solar panels (as described in the co-pending application Ser. No. 11/859, 724) provide lateral rigidity within the rows. The mounting assembly including the base pans and the upright portions is also highly scaleable since any number of base pans can be connected to each other to connect additional rows of solar panels to each other.

Each base pan 26 may further comprise a tab 34 with a through hole as shown in FIG. 3 that may be located at each end of the base pan and may be used to secure a bottom portion of each solar panel to the base pan. In one embodiment, a splice 36 (described in more detail in U.S. patent application Ser. No. 11/859,724, filed on Sep. 21, 2007 and entitled "Mounting System for Solar Panels which is incorporated herein by reference) that is coupled to the solar panel 22 may be inserted through the through hole of the tab 34 to secure the bottom portion of the solar panel to the base pan.

Figure 4:
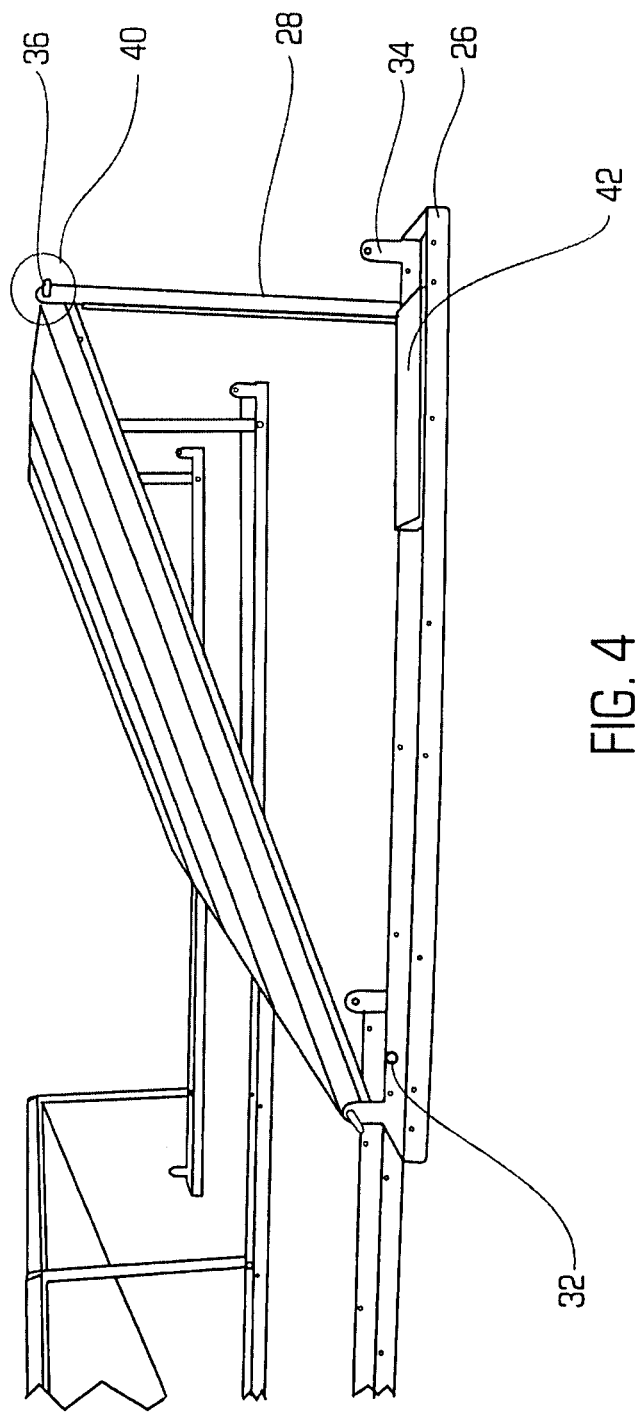
FIG. 4 is a perspective view of the photovoltaic solar panel system that uses the minimal, ballasted roof mounting system.

FIG. 4 is a perspective view of the photovoltaic solar panel system 29 that uses the minimal, ballasted roof mounting system. Each upright part 28 may further include an end portion 40 with a through hole wherein, the upper portion of each solar panel 22 is secured to the upright portion by threading the splice through the through hole as shown. The minimal, ballasted roof mounting system may further comprise a weight 42, such as a ballast block made of a heavy material such as concrete, that fits into a central portion of the base pan formed by the sidewalls of the base pan and can be moved along the length of the base pan to provide optimum placement of the weight 42 depending on climactic and roof conditions (i.e., depending on closeness of edge of roof, wind, etc.) For example, system design engineers can determine how much ballast is required to offset wind loads as well as the location of the ballast. The weight 42 may also hold the minimal, ballasted roof mounting system on uneven surfaces since the base pans 26 are not permanently secured to the roof or other mounting surface.

Figure 5:
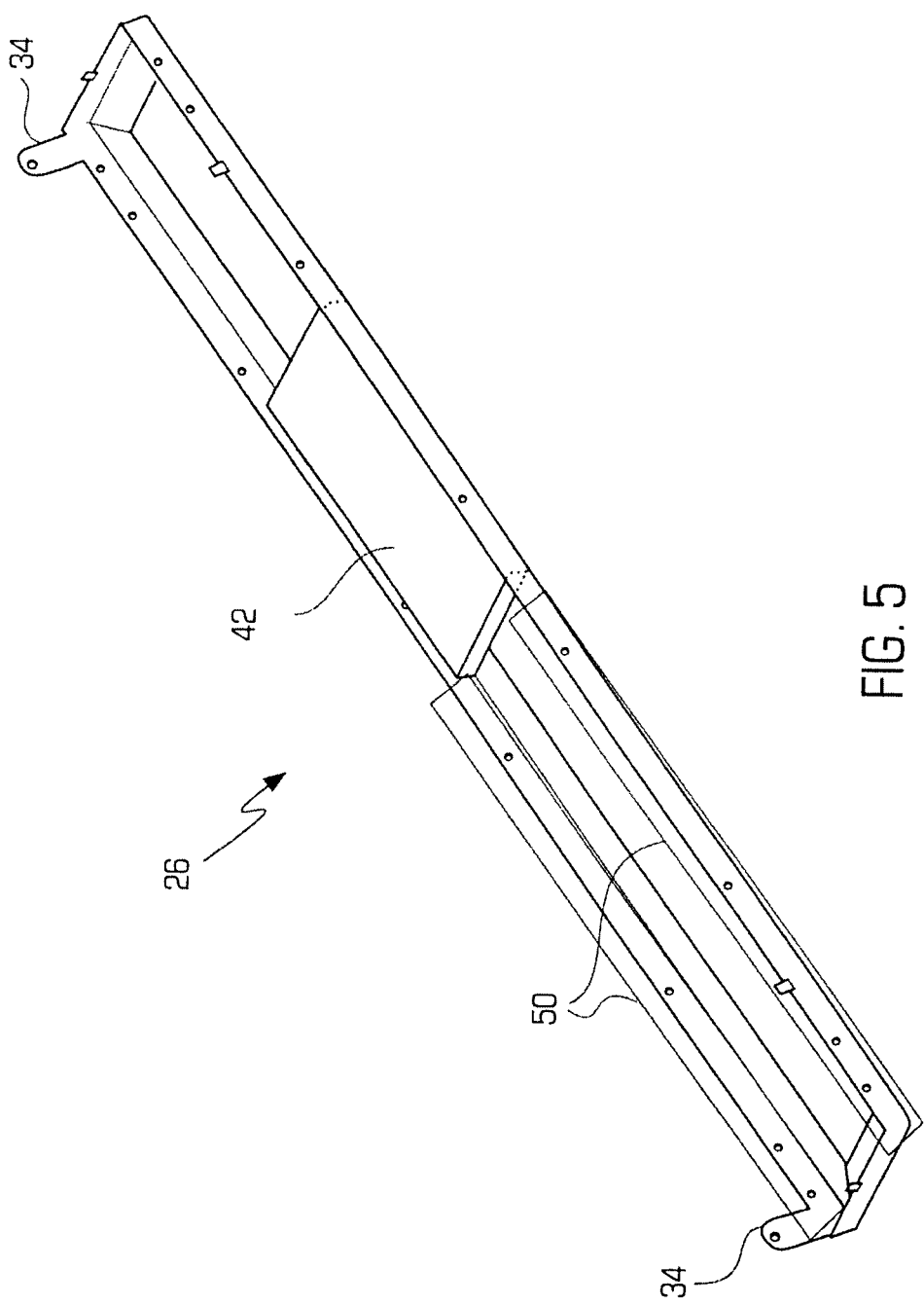
FIG. 5 illustrates more details of a base pan that is part of the minimal, ballasted roof mounting system.

FIG. 5 illustrates more details of the base pan 26 that is part of the minimal, ballasted roof mounting system. In one embodiment, the base pan is made of a strong material that is sufficiently thick to provide longitudinal rigidity for the photovoltaic solar panel system. For example, each base pan may be made of steel. The tabs 34 at each end of the base pan 26 are shown in more detail. In addition, the weight 42 as shown in FIG. 4 rests in a channel in the base pan and is movable along the length of the base pan. Each base pan 26 may further include one or more mounting holes 50 along both sides of the length of the base pan through which the attachment mechanism 32 (as shown in FIG. 3) is placed in order to secure a base pan to an adjacent base pan to form the interlocking structure. The mounting holes 50 allow the adjacent base pans 26 to be slid relative to each other (to provide different configurations) and then secured to each other to form the interlocking structure.

Figure 6:
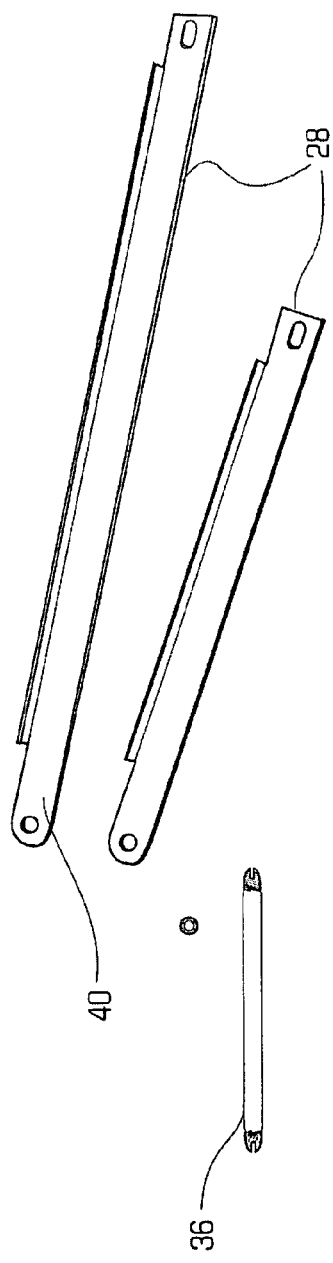
FIG. 6 illustrates more details of an upright portion that is part of the minimal, ballasted roof mounting system.

FIG. 6 illustrates more details of the upright portion 28 that is part of the minimal, ballasted roof mounting system wherein the system may include various different length upright portions (with the end portion 40) that are used to change the tilt angle of the solar panels 22 in the photovoltaic solar panel system. In addition, the splices 36 that are used to secure each solar panel to the minimal, ballasted roof mounting system are also shown.

Figure 7B:
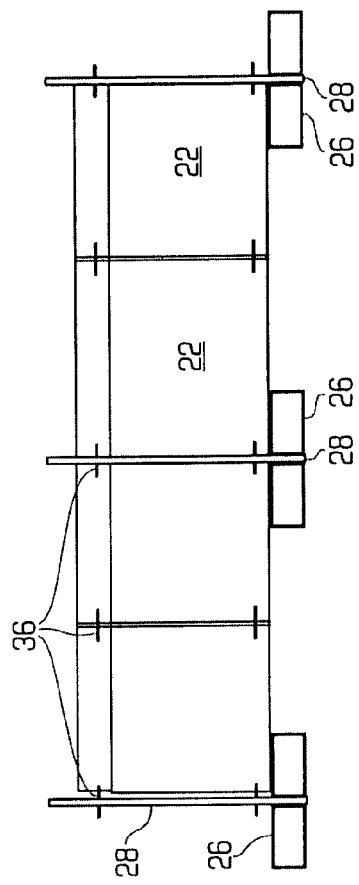
FIGS. 7A and 7B illustrate a side view and a front view, respectively, of a photovoltaic solar panel system that uses the minimal, ballasted roof mounting system.
Figure 7A:
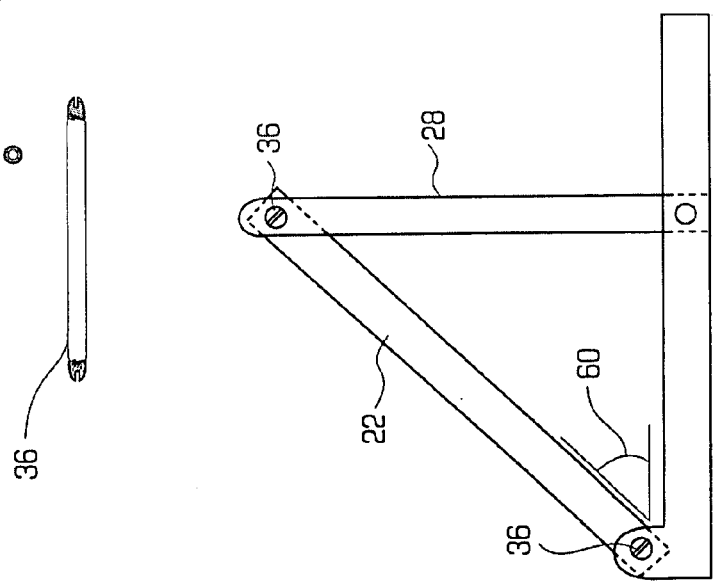

FIGS. 7A and 7B illustrate a side view and a front view, respectively, of a photovoltaic solar panel system that uses the minimal, ballasted roof mounting system. The side view illustrates an adjustable tilt angle 60 of the solar panel 22 that can be adjusted by changing the length of the upright portion 28. As shown in FIG. 7B, when the photovoltaic solar panel system is assembled, there are one or more spaced apart base pans 26 with the upright portions 28 and the solar panels 22 wherein the splices 36 connect adjacent solar panels 22 and connect the solar panels to the upright portions 38 and the base pan.

Figure 9:
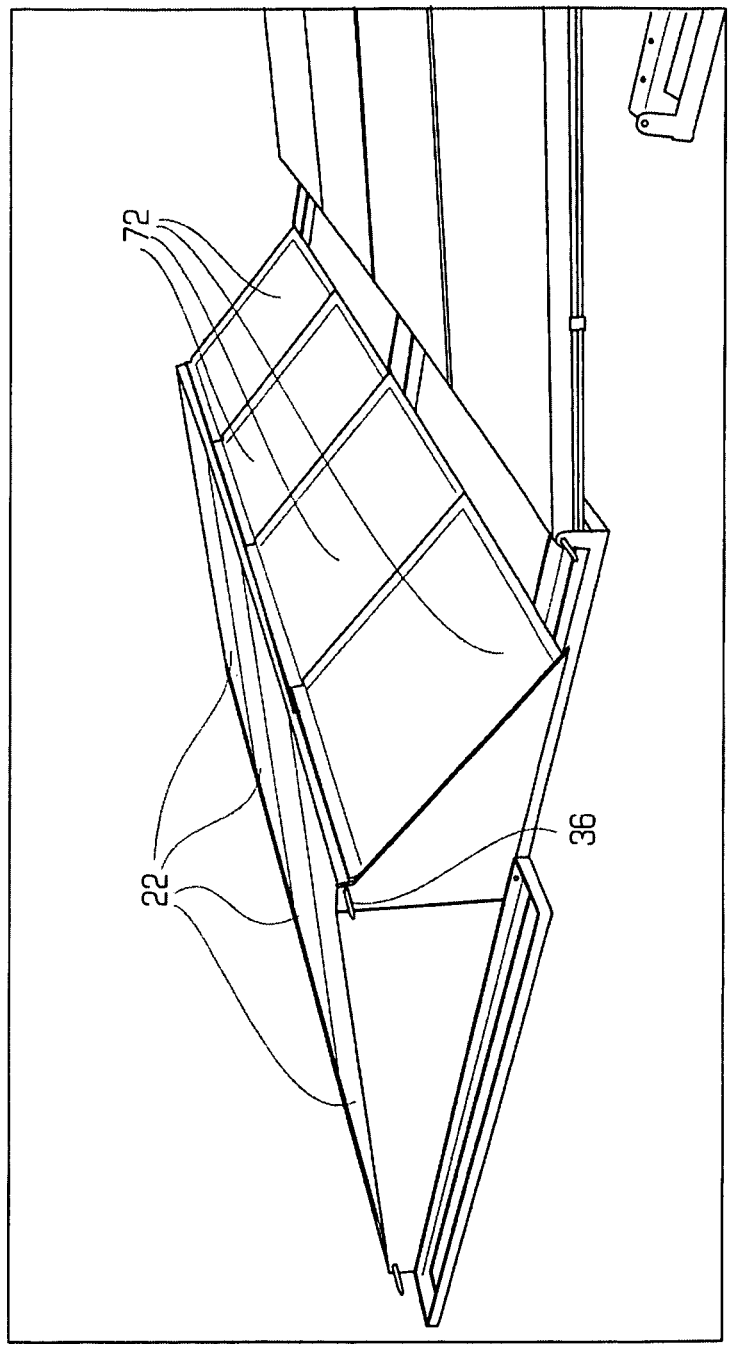
FIG. 9 is perspective view of a photovoltaic solar panel system that uses the minimal, ballasted roof mounting system with the installed aerodynamic deflectors.

FIG. 8 illustrates an aerodynamic deflector 70 of the minimal, ballasted roof mounting system that also acts as a thermal chimney and FIG. 9 is perspective view of a photovoltaic solar panel system that uses the minimal, ballasted roof mounting system with the installed aerodynamic deflectors. The aerodynamic deflector may have a flat portion 72, an end portion 74 connected to the flat portion and a shaped portion 76 connected to the end portion 74. As shown, the shaped portion 76 may extend downwards below the bottom edge of the solar panel 22. The aerodynamic deflector deflects air and prevents the air from getting underneath the solar panel 22 that might cause the photovoltaic solar panel system to be lifted off of the surface on which the photovoltaic solar panel system is mounted or damage the photovoltaic solar panel system. The deflector 70 also acts as a thermal chimney and allows the hot air 78 from the back of the solar panel to be exhausted to the environment so that the heat does not build up underneath the solar panels.

Figure 10:
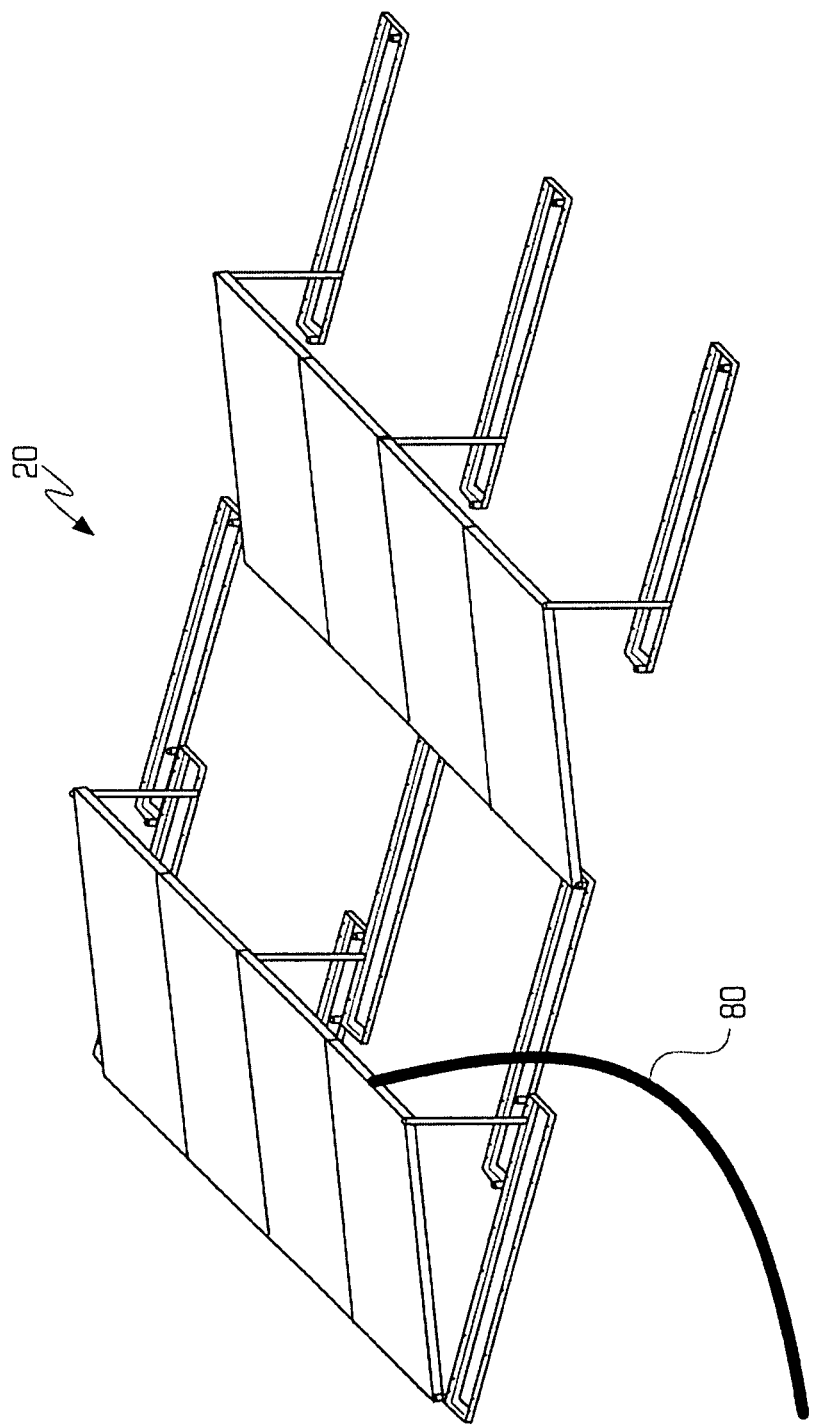
FIG. 10 illustrates a primary grounding path of the minimal, ballasted roof mounting system.
Figure 11:
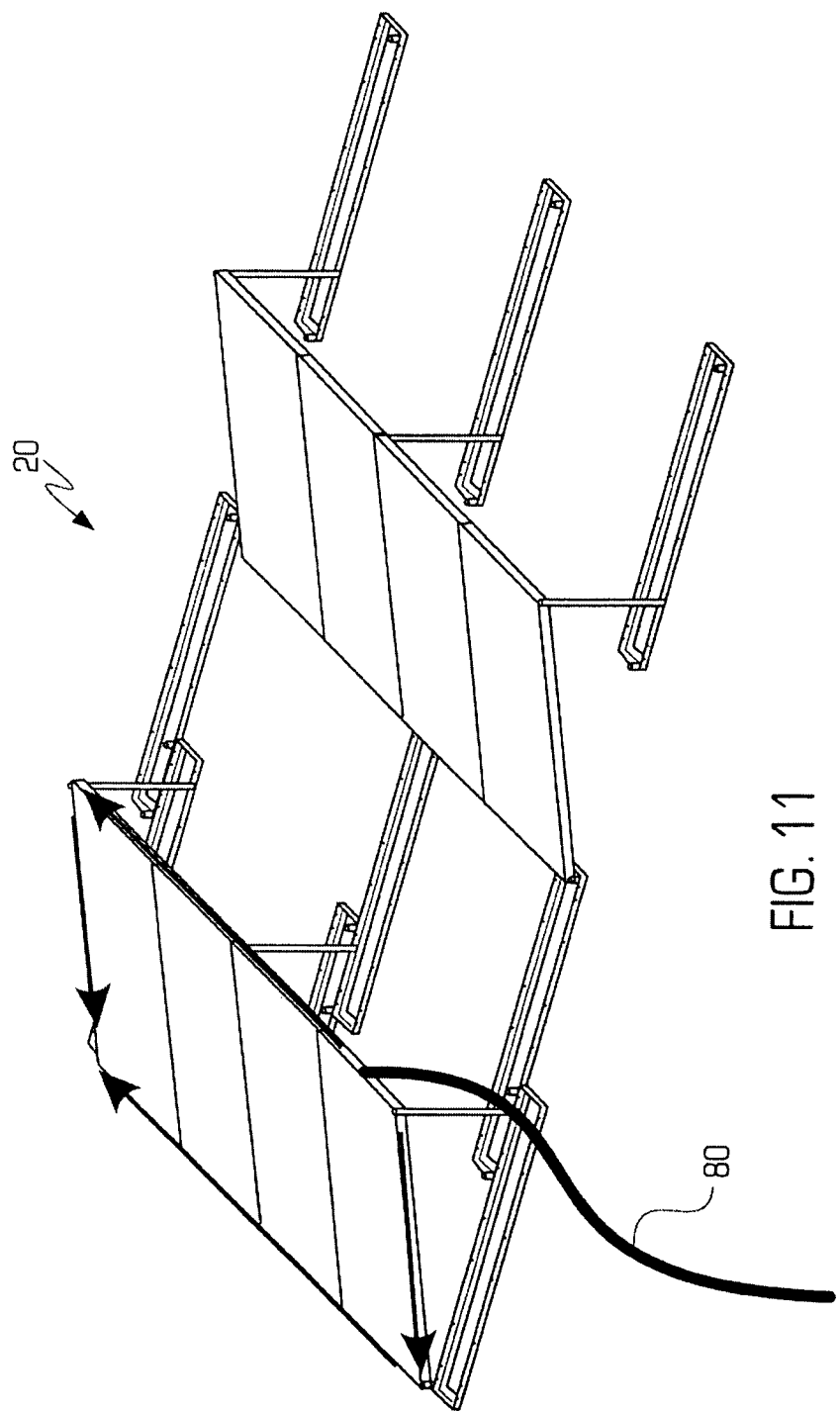
FIG. 11 illustrates the grounding of a row of the photovoltaic solar panel system.
Figure 12:
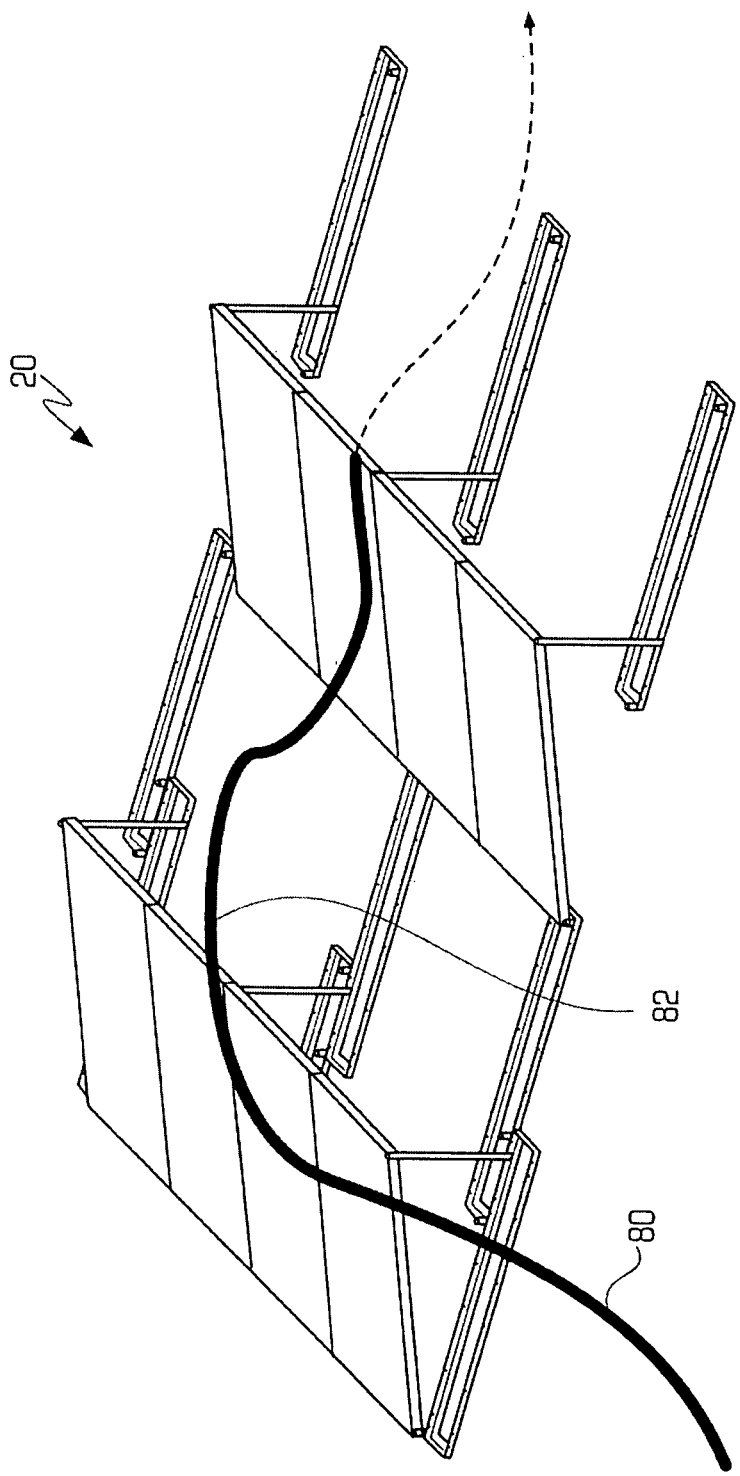
FIG. 12 illustrates the propagation of the grounding path in the photovoltaic solar panel system.
Figure 13:
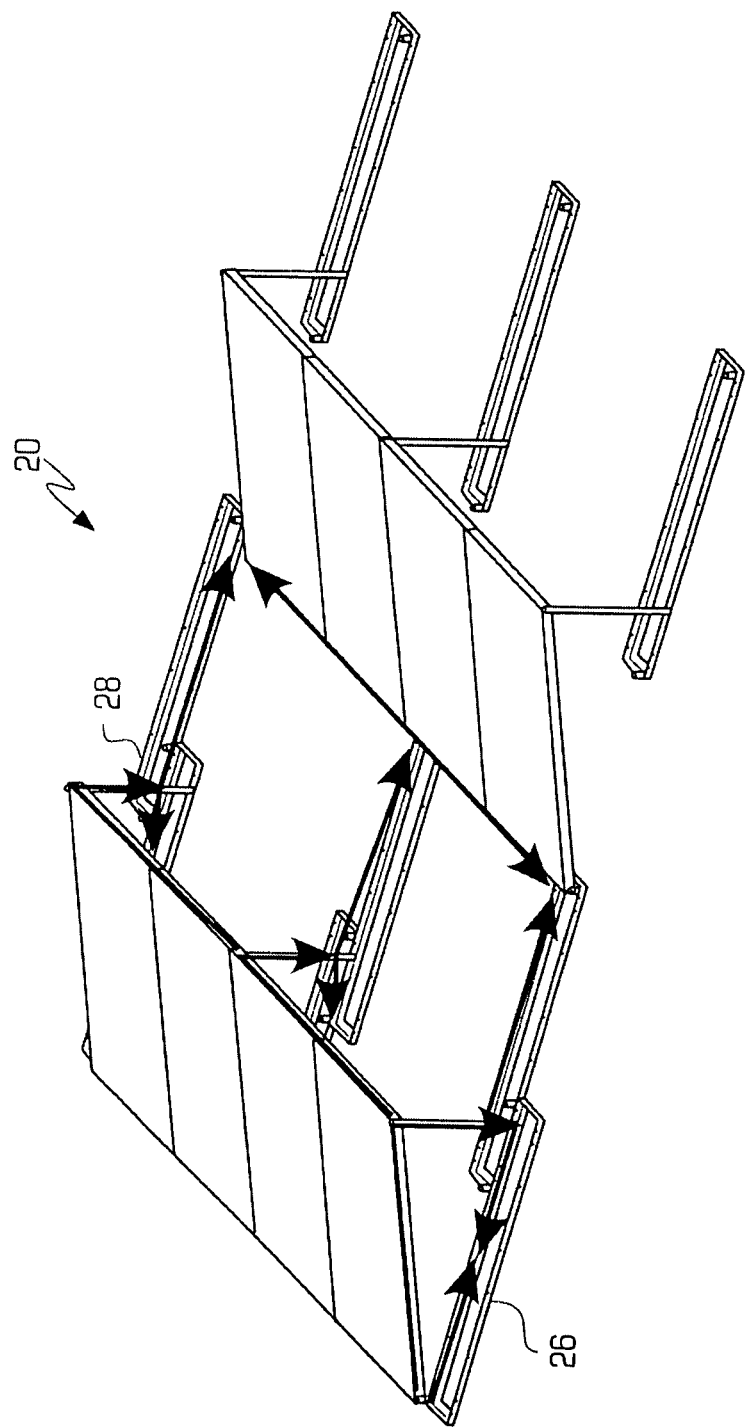
FIG. 13 illustrates the propagation of the grounding path though the minimal, ballasted roof mounting system.

The minimal, ballasted roof mounting system also provide more efficient grounding since the photovoltaic solar panel system substantially reduces the number of external wires because the splices provide grounding of the solar panels (described in more detail in U.S. patent application Ser. No. 11/859,724, filed on Sep. 21, 2007 and entitled "Mounting System for Solar Panels which is incorporated herein by reference), the solar panels are connected to the base pans and upright portions by the splices so that the grounding path from the solar panels to the mounting frame exists in the photovoltaic solar panel system. FIG. 10 illustrates a primary grounding path of the minimal, ballasted roof mounting system in which a primary grounding conductor 80 is an Earth ground point conductor that is connected to the first row of panels at a single connection point for the row as the splices provide the ground path between the solar modular in each row. FIG. 11 illustrates the grounding of a row of the photovoltaic solar panel system in which the entire row has redundant grounding since the frames, base pans and upright portions of the mounting system also provide a ground path as shown by the arrows in FIG. 11. FIG. 12 illustrates the propagation of the grounding path in the photovoltaic solar panel system in which the primary ground 80 is connected to a second ground connector 82 that in turn connects a next row of solar panels (the second row of panels to the first row of panels, the third row of panels to the second row, etc. . . . ). Finally, FIG. 13 illustrates the propagation of the grounding path though the minimal, ballasted roof mounting system wherein the base pans and upright portions are grounding paths as shown by the arrow in this diagram. Thus, the mounting frame provides redundant grounding for a photovoltaic solar panel system that uses the mounting frames.

Figure 14A:
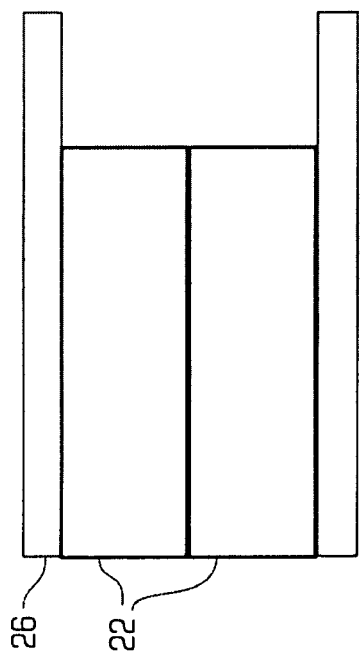
FIGS. 14A-14B illustrate a first process for assembling a photovoltaic solar panel system using the minimal, ballasted roof mounting system.
Figure 14B:
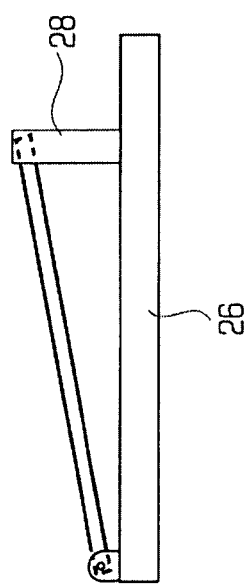

FIGS. 14A-14B illustrate a first process for assembling a photovoltaic solar panel system using the minimal, ballasted roof mounting system. In the first process, two solar panels 22 are mounted in which the base pans are placed into the mounting position and the appropriate length upright portions (for the appropriate tilt angle of the solar panels) are installed and secured to the base pans. Then, the solar panels are installed onto the base pans (using the splices) and then the solar panels are titled upwards and fastened to the upright portions.

Figure 16A:
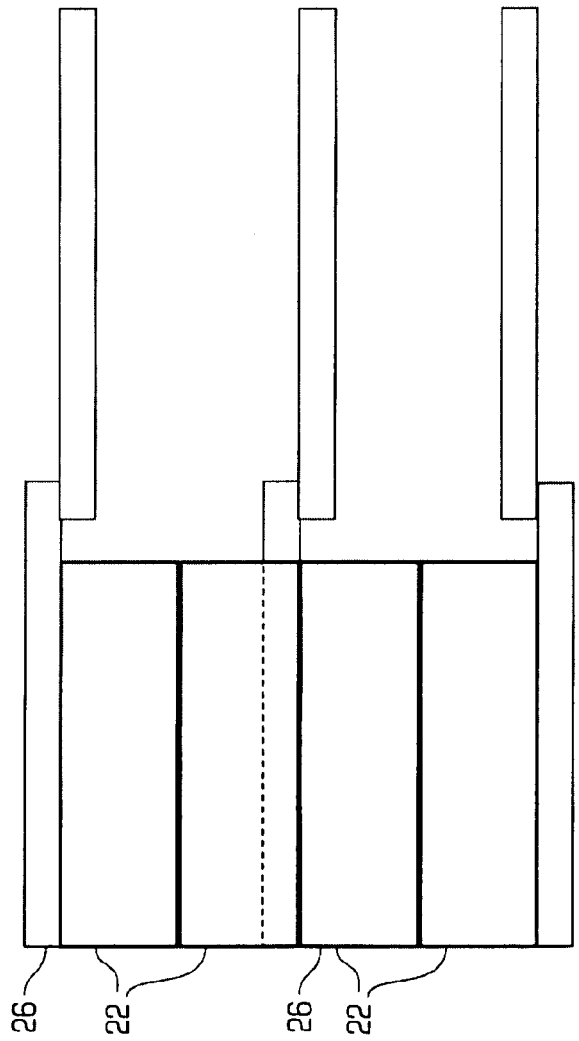
FIGS. 16A-16B illustrate a third process for assembling a photovoltaic solar panel system using the minimal, ballasted roof mounting system.
Figure 16B:
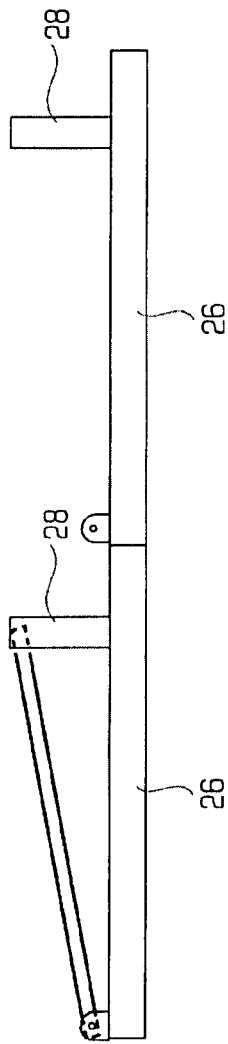
Figure 17A:
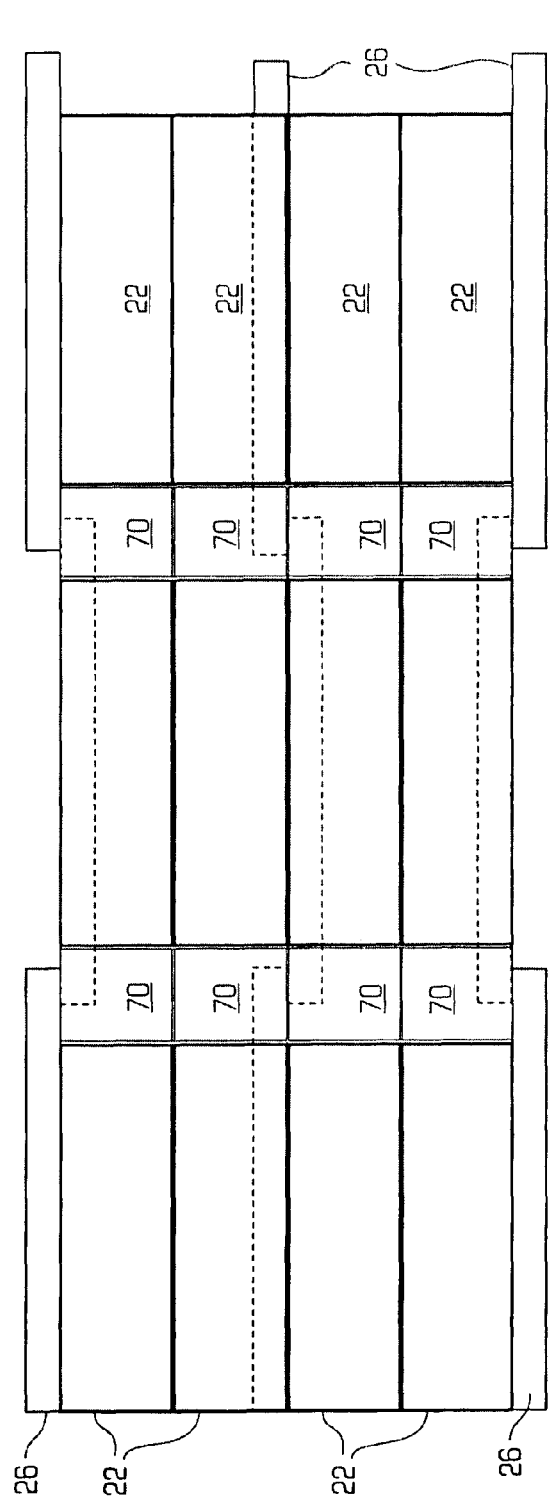
FIGS. 17A-17B illustrate the final assembly process for assembling a photovoltaic solar panel system using the minimal, ballasted roof mounting system.
Figure 17B:
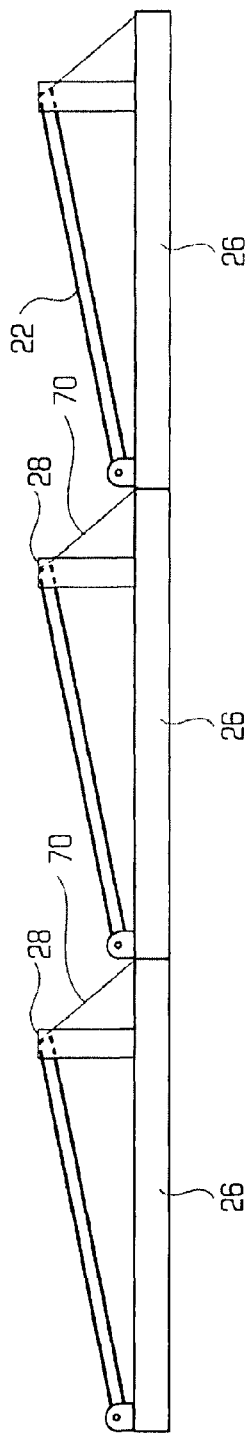

FIGS. 15A-15B illustrate a second process for assembling a photovoltaic solar panel system using the minimal, ballasted roof mounting system. In the second process, another set of solar panels are mounted and installed to form the solar module as shown in FIG. 15A. FIGS. 16A-16B illustrate a third process for assembling a photovoltaic solar panel system using the minimal, ballasted roof mounting system. In the third process, the base pans are interlocked with each other as shown to form the photovoltaic solar panel systems. FIGS. 17A-17B illustrate the final assembly process for assembling a photovoltaic solar panel system using the minimal, ballasted roof mounting system. As shown, the solar modules are coupled to each other to form the photovoltaic solar panel system.

While the foregoing has been with reference to a particular embodiment of the invention, it will be appreciated by those skilled in the art that changes in this embodiment may be made without departing from the principles and spirit of the invention, the scope of which is defined by the appended claims.

The invention claimed is:

1. A photovoltaic solar panel system, comprising:
 a mounting frame having an end portion that secures two or more solar panels in a row to each other at an adjustable angle relative to a surface wherein the mounting frame is not secured to the surface and has a base pan and one or more upright portions connected to the base pan that adjust the angle of the two or more solar panels relative to the surface;
 a second mounting frame having an end portion that secures two or more solar panels in a row to each other at an adjustable angle relative to a surface and has a base pan and one or more upright portions connected to the base pan that adjust the angle of the two or more solar panels relative to the surface; and
 an attachment mechanism that secures the mounting frame and the second mounting frame to each other to provide lateral rigidity to the photovoltaic solar panel system wherein the attachment mechanism secures the mounting frame and the second mounting frame so that the end portion of the mounting frame is staggered relative to the end portion of the second mounting frame.

2. The system of claim 1, wherein the base pan is rectangular.

3. The system of claim 2, wherein the attachment mechanism further comprises a bolt and a nut.

4. The system of claim 3, wherein the surface further comprises a flat roof.

5. The system of claim 1, wherein the base pan further comprises a channel along the length of the base pan and a weight that can be placed into the channel to provide ballast for the mounting frame wherein the weight can be moved along the length of the base pan to adjust the ballasting of the mounting frame.

6. The system of claim 1, wherein the mounting frame and the second mounting frame each further comprise a deflector that prevents air from lifting the two or more solar panels off of the surface.

7. The system of claim 6, wherein the deflector further comprises a thermal chimney structure that directs thermal energy from a bottom surface of the two or more solar panels out from the mounting frame.

8. The system of claim 1, wherein each solar panel further comprises a splice and wherein the mounting frame and the second mounting frame each further comprise a tab that secures each splice of each solar panel to the mounting frame.

9. The system of claim 8, wherein the splice grounds the solar panel and wherein the mounting frame and the second mounting frame form a grounding path from each solar panel to the mounting frame.

10. A photovoltaic solar panel system, comprising:
 a mounting frame having an end portion that secures two or more solar panels in a row to each other at an adjustable angle relative to a surface wherein the mounting frame is not secured to the surface, the mounting frame further comprising a base pan and one or more upright portions connected to the base pan that adjust the angle of the two or more solar panels relative to the surface;
 a second mounting frame having an end portion that secures two or more solar panels in a row to each other at an adjustable angle relative to a surface, the second mounting frame further comprising a base pan and one or more upright portions connected to the base pan that adjust the angle of the two or more solar panels relative to the surface;
 an attachment mechanism that secures the mounting frame and the second mounting frame to each other to provide lateral rigidity to the photovoltaic solar panel system; and
 wherein each base pan further comprises a channel along the length of the base pan and a weight that can be placed into the channel to provide ballast for the mounting frame wherein the weight can be moved along the length of the base pan to adjust the ballasting of the mounting frame.

11. The system of claim 10, wherein the base pan is rectangular.

12. The system of claim 11, wherein the attachment mechanism further comprises a bolt and a nut.

13. The system of claim 12, wherein the surface further comprises a flat roof.

14. The system of claim 10, wherein each solar panel further comprises a splice and wherein the mounting frame and the second mounting frame each further comprise a tab that secures each splice of each solar panel to the mounting frame.

15. The system of claim 14, wherein the splice grounds the solar panel and wherein the mounting frame and the second mounting frame form a grounding path from each solar panel to the mounting frame.

16. A photovoltaic solar panel system, comprising:
 a mounting frame having an end portion that secures two or more solar panels in a row to each other at an adjustable angle relative to a surface wherein the mounting frame is not secured to the surface, the mounting frame further comprising a base pan, one or more upright portions connected to the base pan that adjust the angle of the two or more solar panels relative to the surface and a deflector that prevents air from lifting the two or more solar panels off of the surface wherein the deflector further comprises a thermal chimney structure that directs thermal energy from a bottom surface of the two or more solar panels out from the mounting frame;
 a second mounting frame having an end portion that secures two or more solar panels in a row to each other at an adjustable angle relative to a surface, the second mounting frame further comprising a base pan, one or more upright portions connected to the base pan that adjust the angle of the two or more solar panels relative to the surface and a deflector that prevents air from lifting the two or more solar panels off of the surface wherein the deflector further comprises a thermal chimney structure that directs thermal energy from a bottom surface of the two or more solar panels out from the mounting frame; and
 an attachment mechanism that secures the mounting frame and the second mounting frame to each other to provide lateral rigidity to the photovoltaic solar panel system.

17. The system of claim 16, wherein the base pan is rectangular.

18. The system of claim 16, wherein the attachment mechanism further comprises a bolt and a nut.

19. The system of claim 16, wherein the surface further comprises a flat roof.

20. The system of claim 16, wherein each solar panel further comprises a splice that grounds the solar panel, wherein the mounting frame and the second mounting frame each further comprise a tab that secures each splice of each solar panel to the mounting frame so that a grounding path from each solar panel to the mounting frame is established.

* * * * *